(12) United States Patent
Suzuki et al.

(10) Patent No.: US 8,828,550 B2
(45) Date of Patent: Sep. 9, 2014

(54) DOPANT HOST AND PROCESS FOR PRODUCTION THEREOF

(75) Inventors: Ryota Suzuki, Otsu (JP); Yoshio Umayahara, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 375 days.

(21) Appl. No.: 13/510,725

(22) PCT Filed: Nov. 22, 2010

(86) PCT No.: PCT/JP2010/070764
§ 371 (c)(1),
(2), (4) Date: May 18, 2012

(87) PCT Pub. No.: WO2011/065316
PCT Pub. Date: Jun. 3, 2011

(65) Prior Publication Data
US 2012/0237780 A1    Sep. 20, 2012

(30) Foreign Application Priority Data

Nov. 24, 2009    (JP) ................. 2009-265916

(51) Int. Cl.
| | |
|---|---|
| B32B 13/04 | (2006.01) |
| C03B 29/00 | (2006.01) |
| H01L 21/22 | (2006.01) |
| C04B 35/18 | (2006.01) |
| H01L 21/223 | (2006.01) |

(52) U.S. Cl.
CPC ....... *H01L 21/2225* (2013.01); *C04B 2237/064* (2013.01); *C04B 2237/062* (2013.01); *C04B 2237/341* (2013.01); *C04B 2237/343* (2013.01); *C04B 35/18* (2013.01); *H01L 21/223* (2013.01)
USPC .................. 428/446; 428/702; 156/89.11

(58) Field of Classification Search
CPC ................................... C04B 2237/58
See application file for complete search history.

(56) References Cited

U.S. PATENT DOCUMENTS

| | | | |
|---|---|---|---|
| 4,282,282 A | 8/1981 | Rapp | |
| 4,846,902 A | 7/1989 | Pickrell | |
| 2010/0136314 A1 | 6/2010 | Umayahara et al. | |

FOREIGN PATENT DOCUMENTS

| | | |
|---|---|---|
| JP | 52-55861 A | 5/1977 |
| JP | 2-44716 A | 2/1990 |

(Continued)

OTHER PUBLICATIONS

English translation of Official Communication issued in corresponding International Application PCT/JP2010/070764, mailed on Jun. 21, 2012.

(Continued)

*Primary Examiner* — David Sample
(74) *Attorney, Agent, or Firm* — Keating & Bennett, LLP

(57) ABSTRACT

Provided is a dopant host with which the amount of $B_2O_3$ volatilized is unlikely to decrease over time and that has good $B_2O_3$ volatilizing ability for a long period of time. The dopant host has a laminate that includes a boron component volatilization layer containing 30 to 60 mol % of $SiO_2$, 10 to 30 mol % of $Al_2O_3$, 15 to 50 mol % of $B_2O_3$, and 2 to 15 mol % of RO (R is an alkaline earth metal) and a heat resistant layer containing 8 to 40 mol % of $SiO_2$, 40 to 85 mol % of $Al_2O_3$, 5 to 30 mol % of $B_2O_3$, and 0.5 to 7 mol % of RO (R is an alkaline earth metal). At least one outermost layer of the laminate is composed of the boron component volatilization layer. The laminate further includes the boron component volatilization layer inside the laminate. The boron component volatilization layer constituting at least one outermost layer of the laminate has a $B_2O_3$ content lower than the $B_2O_3$ content in the boron component volatilization layer inside the laminate.

8 Claims, 8 Drawing Sheets

(56) References Cited

FOREIGN PATENT DOCUMENTS

| JP | 2009-117729 A | 5/2009 |
| JP | 2009-177129 A | 8/2009 |
| JP | 2010-74149 A | 4/2010 |
| WO | 2009/060761 A1 | 5/2009 |

OTHER PUBLICATIONS

Official Communication issued in corresponding Chinese Patent Application No. 201080052777.2, mailed on Apr. 28, 2014.
Official Communication issued in International Patent Application No. PCT/JP2010/070764, mailed on Mar. 1, 2011.

DOPANT HOST AND PROCESS FOR PRODUCTION THEREOF

TECHNICAL FIELD

This invention relates to a dopant host and a production method therefor. In particular, this invention relates to a dopant host used to obtain a p-type semiconductor by diffusing boron in a silicon semiconductor, and a production method therefor.

BACKGROUND ART

Heretofore, a dopant host method, a counter BN method, a thermal decomposition method, and the like have been known as methods for forming a p-type region on a silicon semiconductor substrate.

The dopant host method is a technique in which $B_2O_3$, which has volatilized from a $B_2O_3$-containing glass ceramic wafer (a dopant host) disposed so as to be in parallel with a semiconductor wafer such as a silicon wafer while maintaining a certain distance therefrom, is deposited on the semiconductor wafer, and a boron component is thermally diffused within a semiconductor substrate (see, for example, Patent Literature 1).

The counter BN method is a technique that has processes nearly identical to those of the dopant host method. The counter BN method is different from the dopant host method in that a boron nitride wafer that has been subjected to an activation treatment (a treatment to convert BN to $B_2O_3$) is used in place of the glass ceramic wafer.

The thermal decomposition method is a technique in which liquid $BCl_3$, $BBr_3$, or the like is evaporated by bubbling, deposited on a pre-heated semiconductor wafer, decomposed to give a $B_2O_3$-deposited coating, and then thermally diffused.

In the counter BN method, an activation treatment needs to be performed on a dopant host almost every time doping is carried out. In contrast, in the dopant host method, it is necessary to perform an activation treatment only once at the beginning, and subsequent activation treatments are almost unnecessary. Accordingly, use of the dopant host method allows the process cost of p-type region formation to be kept low. In the thermal decomposition method, gas is deposited on a semiconductor wafer, and it is therefore problematic in that, in the case where $B_2O_3$ is diffused in a large-diameter semiconductor wafer, a variation in the deposition amount is large. In contrast, the dopant host method is advantageous in that since a heat treatment is performed such that a glass-ceramic wafer having the same area as a semiconductor wafer is disposed so as to face the semiconductor wafer, a variation in boron component diffusion is suppressed.

CITATION LIST

Patent Literature

Patent Literature 1: JP-A-S52-55861

SUMMARY OF INVENTION

Technical Problem

However, the dopant host disclosed in Patent Literature 1 has poor heat resistance, and therefore the dopant host may warp when repetitively subjected to a heat treatment. A warped dopant host is problematic in that the dopant host comes into contact with a semiconductor wafer, resulting in a reduced yield or a variation in the amount of $B_2O_3$ diffused. Also, the dopant host disclosed in Patent Literature 1 is problematic in that since the amount of $B_2O_3$ volatilized is lower than that in the counter BN method, efficiency of thermal diffusion of $B_2O_3$ on a semiconductor wafer is poor.

In view of the above-described problems, it is possible to envisage the use of a dopant host that has a laminate structure composed of a boron component volatilization layer having a relatively large amount of $B_2O_3$ component and a heat resistant layer having a relatively high $Al_2O_3$ content. This dopant host is highly heat resistant and can attain a large $B_2O_3$ volatilization amount. However, it is likely that with this dopant host the amount of $B_2O_3$ volatilized is reduced over time, and it is difficult to use the dopant host for a long period of time.

Therefore, an object of the present invention is to provide a dopant host with which the amount of $B_2O_3$ volatilized is unlikely to be reduced over time and that has good $B_2O_3$ volatilizing ability for a long period of time.

Solution to Problem

As a result of having conducted diligent research, the inventors found that the above-described problems can be solved by adjusting the $B_2O_3$ content in each boron component volatilization layer in a dopant host having a laminate structure composed of boron component volatilization layers and a heat resistant layer, and accordingly the inventors propose the present invention.

That is, the dopant host according to the present invention has a laminate. The laminate includes a boron component volatilization layer and a heat resistant layer. The boron component volatilization layer contains 30 to 60 mol % of $SiO_2$, 10 to 30 mol % of $Al_2O_2$, 15 to 50 mol % of $B_2O_3$, and 2 to 15 mol % of RO (R is an alkaline earth metal). The heat resistant layer contains 8 to 40 mol % of $SiO_2$, 40 to 85 mol % of $Al_2O_2$, 5 to 30 mol % of $B_2O_2$, and 0.5 to 7 mol % of RO (R is an alkaline earth metal). At least one outermost layer of the laminate is composed of the boron component volatilization layer. The laminate further contains the boron component volatilization layer inside the laminate. The boron component volatilization layer constituting at least one outermost layer of the laminate has a $B_2O_3$ content lower than the $B_2O_3$ content in the boron component volatilization layer inside the laminate.

Since volatilization of a boron component occurs due to the boron component contained in the boron component volatilization layer, the dopant host of the present invention has a $B_2O_3$ content in the boron component volatilization layer of as high as 15 to 50 mol %. Accordingly, the dopant host of the present invention has a high level of $B_2O_3$ volatilization ability. Also, the dopant host of the present invention has an $Al_2O_3$ content in the heat resistant layer of as high as 40 to 85 mol %. Accordingly, the dopant host of the present invention has good heat resistance, being capable of withstanding temperatures of, for example, 1200° C. or higher.

In the dopant host of the present invention, at least one outermost layer of the laminate is composed of the boron component volatilization layer, and the boron component volatilization layer constituting an outermost layer of the laminate has a $B_2O_3$ content lower than the $B_2O_3$ content in the boron component volatilization layer inside the laminate. Accordingly, configuring the boron component volatilization layer disposed as the outermost layer of the laminate so as to have a relatively low $B_2O_3$ content allows the boron component volatilization layer constituting the outermost layer of the laminate to function as a regulating valve for regulating the amount of $B_2O_3$ volatilized as well as the amount of $B_2O_3$ volatilized per unit time to be suppressed. Also, in the dopant host of the present invention, the boron component volatilization layer disposed inside the laminate has a relatively high $B_2O_3$ content. Accordingly, the $B_2O_3$ content in the dopant host as a whole is high. Therefore, the amount of $B_2O_3$ that can be volatilized from the dopant host is large. Hence, the dopant host of the present invention enables stable volatilization of a large amount of $B_2O_3$ over a long period of time.

From the viewpoint of enabling the dopant host to achieve more stable volatilization of $B_2O_3$ over a longer period of time, the $B_2O_3$ content in the boron component volatilization layer disposed as the outermost layer of the laminate is preferably at least 1 mol % lower than the $B_2O_3$ content in the boron component volatilization layer inside the laminate, and more preferably at least 2 mol % lower.

It is preferable that the boron component volatilization layer inside the laminate is provided so as to be adjacent to the boron component volatilization layer constituting at least one outermost layer of the laminate.

This configuration allows the amount of $B_2O_3$ volatilized per unit time to be more suitably controlled, making it easy to demonstrate stable $B_2O_3$ volatilizing ability over a long period of time. This seems to be because the amount of $B_2O_3$ inside the laminate is larger, or that is, creating a $B_2O_3$ concentration gradient allows $B_2O_3$ to be stably supplied to the surface from inside the laminate.

It is preferable that the thickness of the boron component volatilization layer constituting at least one outermost layer of the laminate is greater than the thickness of the boron component volatilization layer inside the laminate.

Configuring the boron component volatilization layer that is disposed as the outermost layer and that has a low $B_2O_3$ content to be thick allows the amount of $B_2O_3$ volatilized per unit time to be more suitably controlled. Consequently, the dopant host having this configuration enables $B_2O_3$ to be volatilized over a longer period of time.

It is preferable that the outermost layers of the laminate are both composed of the boron component volatilization layer.

This configuration makes it easy for $B_2O_3$ to volatilize from both surfaces of the dopant host. Accordingly, it is more likely that $B_2O_3$ is supplied to silicon wafers disposed on either surface side of the dopant host. For example, performing a doping treatment while dopant hosts and silicon wafers are disposed alternately at regular intervals enables a p-type region to be efficiently formed on a plurality of semiconductor substrates. Thus, productivity of p-type semiconductors can be enhanced.

In the dopant host of the present invention, at least one of the boron component volatilization layer and the heat resistant layer may contain glass. Also, at least one of the boron component volatilization layer and the heat resistant layer may contain, in addition to glass, for example, crystals of $Al_2O_3$ or the like, ceramic particles, etc. For example, in the case where the boron component volatilization layer is composed of glass and components other than glass, the boron component volatilization layer as a whole has the aforementioned composition. Also, in the case where the heat resistant layer is composed of glass and components other than glass, the heat resistant layer as a whole has the aforementioned composition. In the present invention, glass encompasses crystallized glass. That is, at least one of the boron component volatilization layer and the heat resistant layer may contain crystallized glass. In the case where at least one of the boron component volatilization layer and the heat resistant layer contains crystallized glass, it is preferable that the crystallized glass is crystallized glass containing $Al_4B_2O_9$ crystals.

In this case, since $Al_4B_2O_9$ crystals are acicular crystals, $Al_4B_2O_9$ crystals sterically entangle with each other in a boron component volatilization layer 2 or a heat resistant layer 3. That is, $Al_4B_2O_9$ crystals become entangled with each other. Accordingly, $Al_4B_2O_9$ crystals contained in the dopant host 1 can improve the heat resistance of the dopant host 1.

The method for producing a dopant host according to the present invention is directed to a method for producing the above-described dopant host of the present invention. With the method for producing a dopant host according to the present invention, a green sheet laminate in which a first green sheet for forming a boron component volatilization layer and a green sheet for forming a heat resistant layer are stacked is sintered to give a laminate including the boron component volatilization layer and the heat resistant layer.

According to the method for producing a dopant host of the present invention, the above-described dopant host of the present invention can be readily produced. Suitably selecting the sizes of the green sheets enables a dopant host having a desired size to be readily produced. Moreover, it is not necessary to carry out a process in which an glass ceramic ingot is produced and then the ingot is cut so as to have a wafer form, thus making it possible to produce a dopant host inexpensively.

DESCRIPTION OF EMBODIMENTS

Embodiment 1

Figure 1:
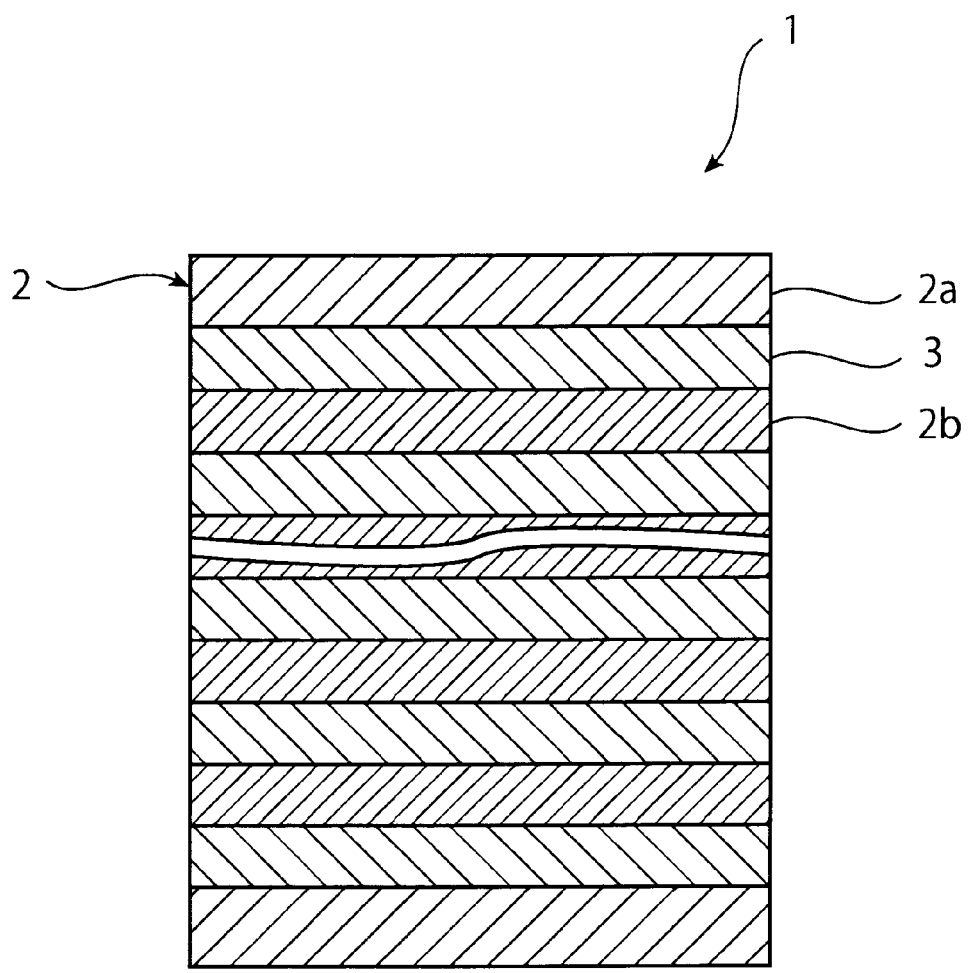
FIG. 1 is a schematic cross-sectional view of a dopant host according to Embodiment 1 of the present invention.

FIG. 1 shows a schematic cross-sectional view of a dopant host according to Embodiment 1 of the present invention. As shown in FIG. 1, a dopant host 1 according to Embodiment 1 is composed of a laminate including a boron component volatilization layer 2 and a heat resistant layer 3. Specifically, the dopant host 1 is composed of a laminate in which a plurality of boron component volatilization layers 2 and a plurality of heat resistant layers 3 are laminated alternately.

The number of boron component volatilization layers 2 included in the dopant host 1 is preferably 3 or larger, and more preferably 5 or larger. Therefore, in the case where the outermost layers of the dopant host 1 are both composed of a boron component volatilization layer 2a, the number of boron component volatilization layers 2b inside the laminate is preferably 3 or larger. This is because the larger the number of boron component volatilization layers 2 included in the dopant host 1, the larger the amount of $B_2O_3$ that can volatilize from the dopant host 1 can be. However, if the number of boron component volatilization layers 2 included in the dopant host 1 is excessively large, the dopant host 1 is thickened and the weight is increased, thus making it possible that handleability is impaired, the number of silicon wafers that can be placed in a thermal diffusion furnace is reduced, and productivity is impaired. Accordingly, the number of boron component volatilization layers 2 included in the dopant host 1 is preferably 50 or smaller, and more preferably 40 or smaller.

The number of heat resistant layers 3 included in the dopant host 1 is preferably 3 or larger, and more preferably 5 or larger. This is because the larger the number of heat resistant layers 3 included in the dopant host 1, the more enhanced the heat resistance of the dopant host is. However, if the number of heat resistant layers 3 included in the dopant host 1 is excessively large, the dopant host 1 is thickened and the weight is increased, thus making it possible that handleability is impaired, the number of silicon wafers that can be placed in a thermal diffusion furnace is reduced, and productivity is impaired. Therefore, the number of heat resistant layers 3 included in the dopant host 1 is preferably 50 or smaller, and more preferably 40 or smaller.

The respective thicknesses of the boron component volatilization layer 2 and the heat resistant layer 3 are not particularly limited. The thickness of the boron component volatilization layer 2 can be, for example, 50 μm to 1000 μm. The thickness of the boron component volatilization layer 2 is preferably 100 μm to 500 μm. An excessively thin boron component volatilization layer 2a may make it difficult to obtain the desired $B_2O_3$ volatilizing ability. On the other hand, with an excessively thick boron component volatilization layer 2, the dopant host 1 may likely crack.

The thickness of the heat resistant layer 3 can be, for example, 30 μm to 300 μm. The thickness of the heat resistant layer 3 is preferably 50 μm to 100 μm. An excessively thin heat resistant layer 3 may impair the heat resistance of the dopant host 1. On the other hand, with an excessively thick heat resistant layer 3, the dopant host 1 may likely crack.

As in this embodiment, in the case where the boron component volatilization layer 2a is disposed as the outermost layers of the dopant host 1, it is preferable that the boron component volatilization layer 2a is thicker than another boron component volatilization layer 2b. In this case, the function of the boron component volatilization layer 2a as a regulating valve can be enhanced, thus making it possible that the dopant host demonstrates excellent $B_2O_3$ volatilizing ability over a longer period of time.

The boron component volatilization layer 2 contains 30 to 60 mol % of $SiO_2$, 10 to 30 mol % of $Al_2O_2$, 15 to 50 mol % of $B_2O_3$, and 2 to 15 mol % of RO (R is an alkaline earth metal). Alkaline earth metals include Mg, Ca, Sr, and Ba. Specifically, the boron component volatilization layer 2 of this embodiment contains glass and crystals such as $Al_2O_2$ crystals or $Al_4B_2O_9$ crystals, and has the aforementioned composition as a whole.

A reason for limiting the content of each component in the boron component volatilization layer 2 as stated above will now be described. Note that, in the following description, the sign "%" refers to "mol %" unless specified otherwise.

$SiO_2$ is a component that constitutes a network of glass contained in the boron component volatilization layer 2. The $SiO_2$ content is 30 to 60% and preferably 35 to 45%. An excessively low $SiO_2$ content may result in lowered chemical durability of the dopant host 1. On the other hand, an excessively high $SiO_2$ content may result in an increased softening point of glass. Accordingly, an excessively high $SiO_2$ content may deteriorate the meltability of glass, making it difficult to shape glass and, as a result, making it difficult to prepare the dopant host 1. $SiO_2$ may be contained in a component other than the glass in the boron component volatilization layer 2.

$Al_2O_3$ is a component that constitutes, together with $SiO_2$, a network of glass contained in the boron component volatilization layer 2. The $Al_2O_3$ content is 10 to 30% and preferably 15 to 25%. An excessively low $Al_2O_3$ content may result in lowered chemical durability of the dopant host 1. On the other hand, an excessively high $Al_2O_3$ content may result in increased porosity of the boron component volatilization layer 2, thus reducing the strength of the boron component volatilization layer 2. $Al_2O_3$ may be contained in a component other than the glass in the boron component volatilization layer 2.

$B_2O_3$ is a volatile component. The $B_2O_3$ content is 15 to 50% and preferably 20 to 40%. An excessively low $B_2O_3$ content may result in an insufficient amount of $B_2O_3$ volatilized from the dopant host 1. An excessively high $B_2O_3$ content may result in lowered chemical durability of the dopant host 1. Also, an excessively high $B_2O_3$ content may result in an excessively increased amount of $B_2O_3$ volatilized from the boron component volatilization layer 2, creating a BSi film on a silicon wafer when a doping treatment is performed. It is difficult to remove the BSi film by etching with fluoric acid or the like, and the BSi film causes failure.

The boron component volatilization layer 2 includes the boron component volatilization layer 2a disposed as the outermost layer of the laminate that constitutes the dopant host 1 and the boron component volatilization layer 2b disposed inside the laminate.

The $B_2O_3$ content in each of the boron component volatilization layers 2a and 2b is 15 to 50%, provided that the $B_2O_3$ content in the boron component volatilization layer 2a disposed as the outermost layer is lower than the $B_2O_3$ content in the boron component volatilization layer 2b disposed inside. The $B_2O_3$ content in the boron component volatilization layer 2a disposed as the outermost layer is preferably at least 1 mol % lower than the $B_2O_3$ content in the boron component volatilization layer 2b disposed inside, and more preferably at least 2 mol % lower. When the difference between the $B_2O_3$ content in the boron component volatilization layer 2a disposed as the outermost layer and the $B_2O_3$ content in the boron component volatilization layer 2b disposed inside is excessively small, the function as a regulating valve of the boron component volatilization layer 2a disposed as the outermost layer is not sufficiently attained, and the duration of $B_2O_3$ volatilization from the dopant host may be short.

Specifically, the $B_2O_3$ content in the boron component volatilization layer 2a disposed as the outermost layer is preferably 25 to 35%, and more preferably 27 to 32%. On the other hand, the $B_2O_3$ content in the boron component volatilization layer 2b disposed inside is preferably 30 to 40%, and more preferably 30 to 38%.

RO is a component that facilitates vitrification. MgO, CaO, SrO, and BaO can be selected for RO, and these can be used singly or as a combination of two or more. The RO content (total amount) is 2 to 15% and preferably 2.5 to 10%. When the RO content is excessively low, vitrification sometimes barely proceeds. On the other hand, an excessively high RO content may result in lowered chemical durability of the dopant host 1. RO may be contained in a component other than the glass in the boron component volatilization layer 2.

In addition, the boron component volatilization layer 2 can contain components such as $ZrO_2$ and $TiO_2$ in a total amount of 30% or less to, for example, enhance chemical durability.

The heat resistant layer 3 contains 8 to 40% of $SiO_2$, 40 to 85% of $Al_2O_3$, 5 to 30% of $B_2O_3$, and 0.5 to 7% of RO (R is an alkaline earth metal). Specifically, the heat resistant layer 3 of this embodiment contains glass and crystals such as $Al_2O_3$ crystals or $Al_4B_2O_9$ crystals, and has the aforementioned composition as a whole.

Next, a reason for limiting the content of each component in the heat resistant layer 3 as stated above will now be described.

$SiO_2$ is a component that constitutes a network of glass contained in the heat resistant layer 3. The $SiO_2$ content is 8 to 40% and preferably 20 to 30%. An excessively low $SiO_2$ content may result in lowered chemical durability of the dopant host 1. On the other hand, an excessively high $SiO_2$ content may result in an increased softening point of glass and thus an excessively small amount of $B_2O_3$ volatilized. This is because an increased softening point of glass results in an increased viscosity of the glass, limiting the movement of $B_2O_3$ and thus making volatilization unlikely. $SiO_2$ may be contained in a component other than the glass in the heat resistant layer 3.

$Al_2O_2$ is a principal component for maintaining heat resistance. The $Al_2O_3$ content is 40 to 85% and preferably 40 to 55%. An excessively low $Al_2O_3$ content may result in impaired heat resistance of the dopant host 1. On the other hand, an excessively high $Al_2O_2$ content may result in increased porosity of the heat resistant layer 3, thus reducing the strength of the dopant host 1. $Al_2O_2$ may be contained as $Al_2O_2$ crystals, thus making it possible to further enhance the heat resistance of the dopant host 1.

$B_2O_3$ is a component of the glass contained in the heat resistant layer 3. The $B_2O_3$ content is 5 to 30% and preferably 10 to 30%. An excessively low $B_2O_3$ content may result in lowered mechanical strength of the dopant host 1. On the other hand, an excessively high $B_2O_3$ content results in excessively low heat resistance of the heat resistant layer 3, and the dopant host 1 may likely deform even at temperatures lower than, for example, 1200° C. $B_2O_3$ may be contained in a component other than the glass in the heat resistant layer 3.

RO is a component that facilitates vitrification. MgO, CaO, SrO, and BaO can be selected for RO, and these can be used singly or as a combination of two or more. The RO content (total amount) is 0.5 to 7% and preferably 2.5 to 6%. When the RO content is excessively low, vitrification sometimes barely proceeds. On the other hand, an excessively high RO content may result in lowered heat resistance of the dopant host 1. RO may be contained in a component other than the glass in the heat resistant layer 3.

In addition, the heat resistant layer 3 may contain components such as $ZrO_2$ and $TiO_2$ in a total amount of 30% or less to, for example, enhance the heat resistance of the heat resistant layer 3.

It is preferable that the dopant host 1 contains $Al_4B_2O_9$ crystals. Specifically, it is preferable that at least one of the boron component volatilization layer 2 and the heat resistant layer 3 contains $Al_4B_2O_9$ crystals. It is more preferable that both the boron component volatilization layer 2 and the heat resistant layer 3 contain $Al_4B_2O_9$ crystals. Since $Al_4B_2O_9$ crystals are acicular crystals, $Al_4B_2O_9$ crystals sterically entangle with each other in the boron component volatilization layer 2 and the heat resistant layer 3. That is, $Al_4B_2O_9$ crystals become entangled with each other. Accordingly, $Al_4B_2O_9$ crystals contained in the dopant host 1 can improve the heat resistance of the dopant host 1. Also, $Al_4B_2O_9$ crystals contained in the dopant host 1 can increase the amount of $B_2O_3$ volatilized.

The $Al_4B_2O_9$ content in the dopant host 1 is preferably 20 to 50 mass % and more preferably 30 to 50 mass %. The $Al_4B_2O_9$ content in the boron component volatilization layer 2 is preferably 10 to 30 mass % and more preferably 10 to 20 mass %. The $Al_4B_2O_9$ content in the heat resistant layer 3 is preferably 30 to 60 mass % and more preferably 35 to 50 mass %. An excessively low $Al_4B_2O_9$ crystal content may result in excessively low heat resistance of the dopant host 1 or an excessively small amount of $B_2O_3$ volatilized. On the other hand, an excessively high $Al_4B_2O_9$ crystal content may result in excessively large porosity of the dopant host 1, thus reducing the strength of the dopant host 1.

At least one of the boron component volatilization layer 2 and the heat resistant layer 3 may contain, other than $Al_4B_2O_9$ crystals, $Al_2O_3$ crystals (α-corundum crystals). The $Al_2O_3$ crystal content in each of the boron component volatilization layer 2 and the heat resistant layer 3 is preferably 0 to 60 mass % and more preferably 10 to 50 mass %. The $Al_2O_3$ crystals (α-corundum crystals) may be derived from unreacted components of ingredient alumina powder.

As described above, in this embodiment, the $B_2O_3$ content in the boron component volatilization layer 2a disposed as the outermost layer of the laminate is lower than the $B_2O_3$ content in the boron component volatilization layer 2b inside the laminate. That is, the $B_2O_3$ content in the boron component volatilization layer 2a disposed as the outermost layer of the laminate is relatively high, and the $B_2O_3$ content in the boron component volatilization layer 2b inside the laminate is relatively high. Configuring the $B_2O_3$ content in the boron component volatilization layer 2a disposed as the outermost layer of the laminate so as to be relatively low as stated above allows suppression of the amount of $B_2O_3$ volatilized per unit time. Since the $B_2O_3$ content in the boron component volatilization layer 2b inside the laminate is relatively high, the $B_2O_3$ content of the dopant host 1 as a whole is high. Accordingly, the amount of $B_2O_3$ that can be volatilized from the dopant host 1 is large. Hence, the dopant host 1 enables stable volatilization of a large amount of $B_2O_3$ over a long period of time.

From the viewpoint of achieving stable volatilization of a large amount of $B_2O_3$ from the dopant host 1 over a longer period of time, the difference between the $B_2O_3$ contents of the boron component volatilization layer 2a disposed as the outermost layer and the boron component volatilization layer 2b inside the laminate is preferably 1% or greater and more preferably 2% or greater.

When the boron component volatilization layer 2a is excessively thin, the valve function of the boron component volatilization layer 2a may not be sufficiently demonstrated. Accordingly, it is preferable that the boron component volatilization layer 2a is thicker than the boron component volatilization layer 2b. Configuring the boron component volatilization layer 2a so as to be thicker than the boron component volatilization layer 2b enables $B_2O_3$ to be volatilized over a longer period of time. Specifically, the thickness of the boron component volatilization layer 2a is preferably 50 μm or greater and more preferably 60 μm or greater.

When boron component volatilization layers 2 have different compositions, the shrinkages attained when forming the boron component volatilization layers 2 by sintering are different as well. Therefore, the more the kinds of boron component volatilization layer 2 (the larger the number of different compositions) included in the dopant host 1, the more likely the deformation generated between the boron component volatilization layer 2 and the heat resistant layer 3, and the durability of the dopant host 1 tends to be reduced. From this viewpoint, it is preferable that 3 or fewer kinds of boron component volatilization layer 2 are included in the dopant host 1.

Although the order of laminating the boron component volatilization layer 2 and the heat resistant layer 3 is not particularly limited, it is preferable that the boron component volatilization layer 2 and the heat resistant layer 3 are laminated alternately as shown in FIG. 1. In this case, this is because the $B_2O_3$ volatilizing ability and the heat resistance of the dopant host 1 can be further enhanced.

In the dopant host 1 of this embodiment, both outermost layers are composed of the boron component volatilization layer 2a. Accordingly, $B_2O_3$ preferably volatilizes from both surfaces of the dopant host 1. Therefore, even in the case where silicon wafers are disposed on either surface side of the dopant host 1, it is possible to dope the silicon wafers with a boron component. For example, disposing a silicon wafer on each side of the dopant host 1 enables simultaneous formation of a p-type region on these two silicon wafers. Therefore, use of the dopant host 1 of this embodiment enables production of p-type semiconductors with high productivity.

Hereinbelow, another example of a preferable embodiment of the present invention will now be described. In the description below, members that have substantially the same functions as those in Embodiment 1 above are given the same reference numbers, and descriptions thereof are omitted.

Embodiment 2

Figure 2:
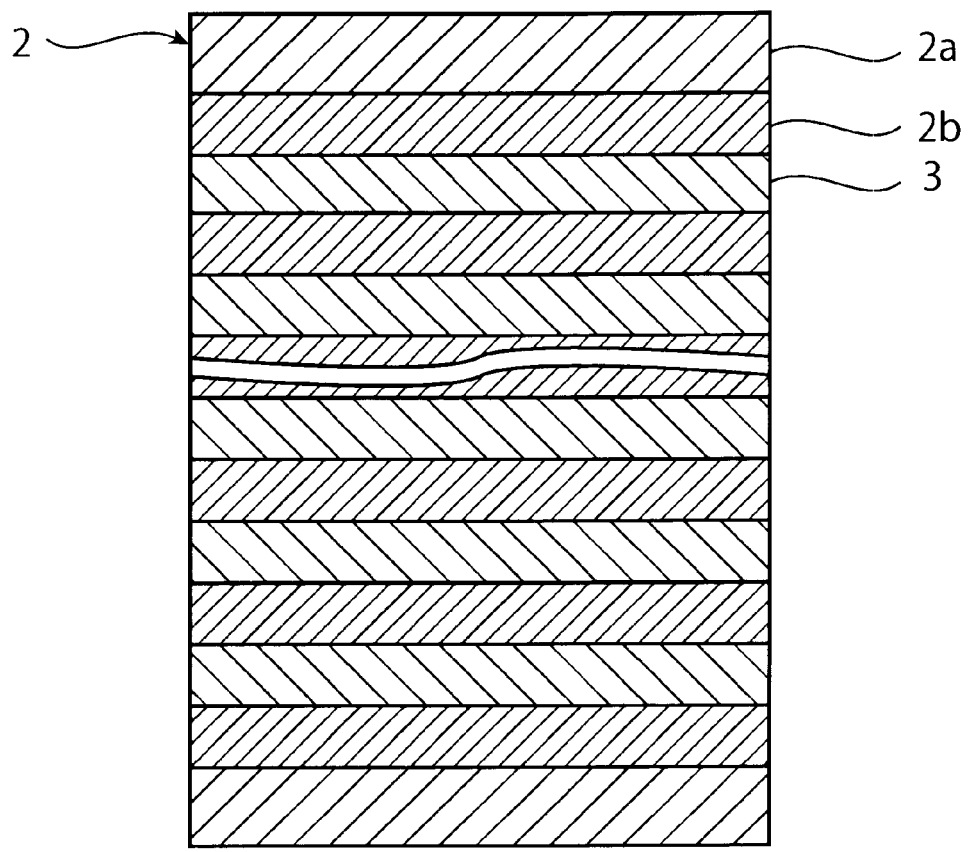
FIG. 2 is a schematic cross-sectional view of a dopant host according to Embodiment 1 of the present invention.

FIG. 2 is a schematic cross-sectional view of a dopant host according to Embodiment 2 of the present invention.

In Embodiment 1 above, a description was given of an example in which the boron component volatilization layer 2a of the outermost layer and the heat resistant layer 3 are disposed adjacent to each other. However, the present invention is not limited to this configuration. With the dopant host of the present invention, boron component volatilization layers or heat resistant layers are provided so as to be adjacent to each other.

As shown in FIG. 2, in the dopant host of this embodiment, the boron component volatilization layer 2a disposed as the outermost layer is adjacent to the boron component volatilization layer 2b having a higher $B_2O_3$ content than the boron component volatilization layer 2a. Accordingly, the dopant host of this embodiment demonstrates more stable $B_2O_3$ volatilizing ability over a longer period of time. Although the reason why this effect is obtained is not clear, this seems to be because the amount of $B_2O_3$ inside the laminate is larger, or that is, creating a $B_2O_3$ concentration gradient allows $B_2O_3$ to be stably supplied to the surface from inside the laminate.

It is possible to envisage that a plurality of boron component volatilization layers 2b, which have a higher $B_2O_3$ content than the boron component volatilization layer 2a, are consecutively disposed more toward the center than the boron component volatilization layer 2a of the outermost layer. However, in such a case, deformation generated between boron component volatilization layers 2 is large, and the durability of the dopant host 1 is likely to be reduced. Therefore, in the case where the boron component volatilization layer 2a is disposed adjacent to the boron component volatilization layer 2b, it is preferable to dispose the heat resistant layer 3 on the side of the boron component volatilization layer 2b opposite the boron component volatilization layer 2a.

(Method for Producing Dopant Host)

A method for producing the dopant host of each of the above-described Embodiments 1 and 2 is not particularly limited. Hereinbelow, an example of a method for producing the dopant host 1 will now be described.

First, a boron component volatilization layer green sheet for forming the boron component volatilization layer 2 is prepared. The boron component volatilization layer green sheet can be prepared, for example, as described below.

First, ingredient powders containing $SiO_2$, $Al_2O_3$, $B_2O_3$, and RO are blended so as to give a batch. The batch is vitrified by, for example, being melted for about 1 hour and at around 1600° C., and then is formed, milled, and classified to give glass powder.

Next, a binder, a plasticizer, a solvent, and the like are added to the glass powder and kneaded to give a slurry. Alumina powder may be blended with the slurry to make it easy to precipitate $Al_4B_2O_9$ crystals.

A thermoplastic resin is usually used for the binder. The thermoplastic resin is a component that increases post-drying film strength and imparts flexibility. The thermoplastic resin content in the slurry is generally about 5 to 30 mass % in the slurry.

Examples of usable thermoplastic resins include acrylic resins such as polybutyl methacrylate, polymethyl methacrylate, and polyethyl methacrylate, polyvinyl butyral, ethylcellulose, and the like. These can be used singly or as a combination.

The plasticizer is a component that controls the rate of drying and imparts flexibility to a dried film. The plasticizer content is generally about 0 to 10 mass % in the slurry. Examples of usable plasticizers include butyl benzyl phthalate, dioctyl phthalate, diisooctyl phthalate, dicapryl phthalate, dibutyl phthalate, and the like. These can be used singly or as a combination.

The solvent is a component for processing the ingredients into a paste form. The solvent content in the slurry is generally about 10 to 50 mass %. Examples of usable solvents include terpineol, methyl ethyl ketone, diethylene glycol monobutyl ether acetate, 2,2,4-trimethyl-1,3-pentadiol monoisobutyrate, and the like. These can be used singly or as a combination.

Next, the resulting slurry is shaped into a sheet form so as to be on a film having excellent mechanical and thermal stability made of polyethylene terephthalate (PET) or the like by, for example, a doctor blade method, and dried to remove the solvent and the like. Thereby, the boron component volatilization layer green sheet can be produced.

The proportion of the ingredient powders present in the boron component volatilization layer green sheet is generally about 60 to 95 mass %.

The thickness of the boron component volatilization layer green sheet is preferably 30 to 1500 μm, more preferably 50 to 1000 μm, even more preferably 100 to 500 μm, and still more preferably 150 to 300 μm. It may be difficult to prepare an excessively thin boron component volatilization layer green sheet, and such a green sheet may likely break during lamination. On the other hand, an excessively thick boron component volatilization layer green sheet may likely crack during drying.

In the case where the boron component volatilization layer green sheet is prepared by a doctor blade, the viscosity of the slurry is preferably 1 to 50 Pa·s, more preferably 2 to 30 Pa·s, and even more preferably 3 to 20 Pa·s. An excessively low slurry viscosity may result in generation of craters when forming the green sheet, a large variation in green sheet thickness, and like problems. On the other hand, an excessively high slurry viscosity impairs the fluidity of the slurry, thus creating uneven portions and streaks on the green sheet, and a uniform film can be barely obtained. Also, the amount of the slurry adhered to pipes and containers is increased, and the material loss tends to be large. The viscosity of the slurry can be adjusted by suitably selecting the amounts of binder, plasticizer, and solvent added.

A heat resistant layer green sheet is prepared by the same method as that for the boron component volatilization layer green sheet using, for example, a mixture of alumina powder and glass powder containing $SiO_2$, $B_2O_3$, and RO as ingredient powders.

The resulting two kinds of green sheet are laminated and pressure-bonded into a single body. The total number of sheets to be laminated are suitably selected from the range of, for example, 3 to 100 according to the thickness of the green sheets. It is more preferable that the number of sheets to be laminated is 5 to 50. The resulting green sheets are punched out so as to attain a desired shape as necessary. The green sheets may be punched out so as to attain a desired shape and then laminated, or may be laminated and then punched out.

Thereafter, it is possible to obtain a boron-doped material for a semiconductor by sintering the laminate of the green sheets. The sintering temperature is preferably 1000 to 1300° C. and more preferably 1100 to 1200° C. The sintering time is suitably adjusted so as to be between, for example, 0.5 to 100 hours according to the sintering temperature. The sintering time is preferably 50 to 100 hours.

EXAMPLES

The present invention shall be described in detail below by way of examples, but the present invention is not limited to the examples.

Examples 1 to 3 and Comparative Example 1

First, glass ingredients were blended so as to attain a specific glass composition, and then placed in a platinum crucible and melted at 1400° C. to 1650° C. for 3 hours. The molten glass was poured between a pair of water-cooled rollers to be formed into a thin plate. Next, after the resulting article having a thin plate shape was roughly milled by a ball mill, alcohol was added, and wet-milling was performed so as to attain a 50% particle size ($D_{50}$) of 2.5 µm. Through the above-described steps, ingredient glass powder was prepared. This ingredient glass powder itself was used as an ingredient of a boron component volatilization layer. On the other hand, an ingredient powder for a heat resistant layer used was prepared by blending the aforementioned ingredient glass powder and alumina powder so as to have a specific composition.

Next, a binder (acrylic resin), a plasticizer (butyl benzyl phthalate), and a solvent (methyl ethyl ketone) were added to the respective powders to prepare slurries. The resulting slurries were shaped so as to have specific thicknesses by a doctor blade method, thereby preparing a boron component volatilization layer green sheet and a heat resistant layer green sheet. After drying, the green sheets were cut so as to produce disks having specific sizes. Then, a plurality of resulting boron component volatilization layer green sheets and resulting heat resistant layer green sheets were laminated, processed into a single body by thermal pressure bonding, and then sintered at 900 to 1300° C. to give a dopant host.

Figure 3:
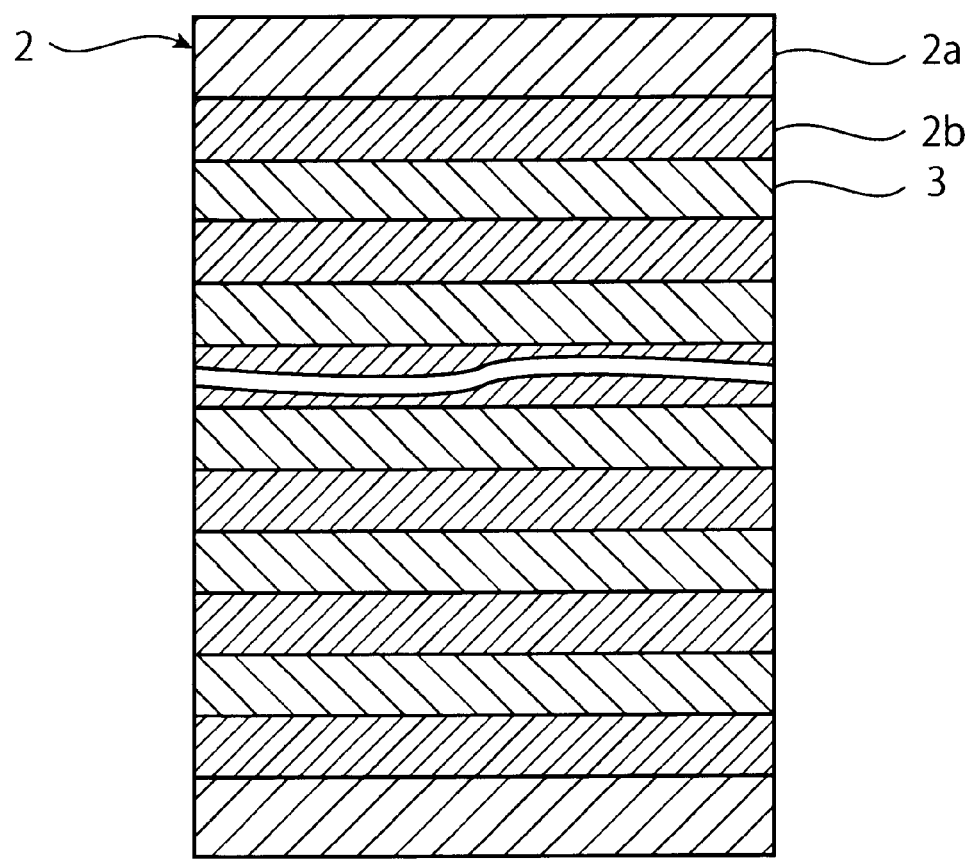
FIG. 3 is a schematic cross-sectional view of a dopant host prepared in Example 1.

In Example 1, the boron component volatilization layer green sheet and the heat resistant layer green sheet were laminated such that the boron component volatilization layer 2 and the heat resistant layer 3 were laminated as shown in FIG. 3. That is, the dopant host of Example 1 had substantially the same configuration as the dopant host of Embodiment 2 above.

Figure 4:
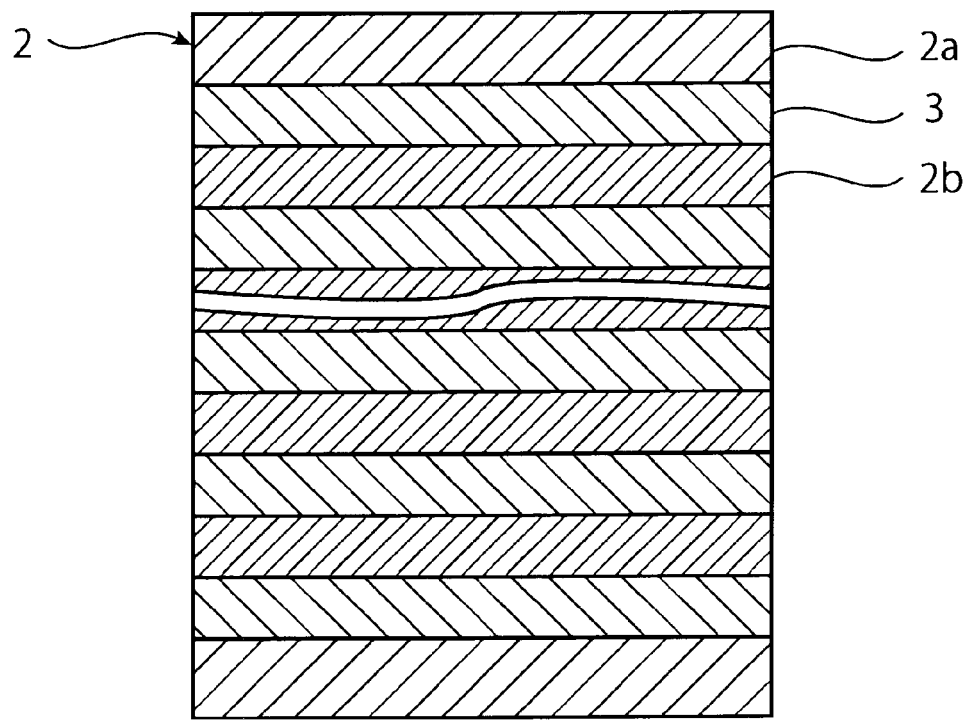
FIG. 4 is a schematic cross-sectional view of a dopant host prepared in Example 2.
Figure 5:
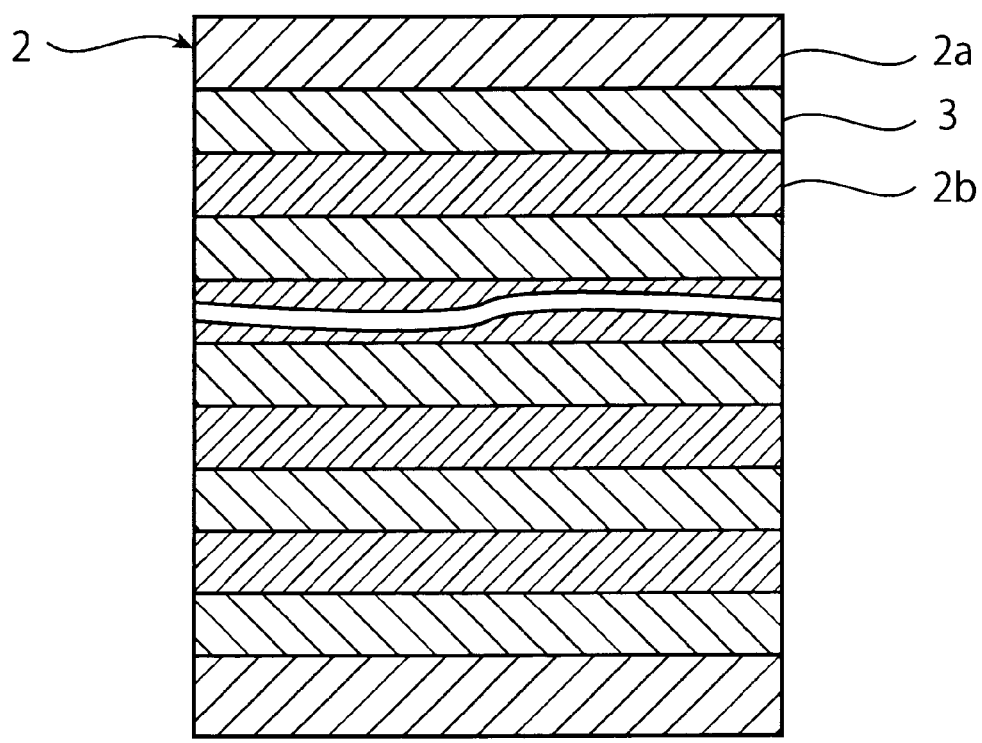
FIG. 5 is a schematic cross-sectional view of a dopant host prepared in Example 3.

In Example 2, the boron component volatilization layer green sheet and the heat resistant layer green sheet were laminated such that the boron component volatilization layer 2 and the heat resistant layer 3 were laminated as shown in FIG. 4. In Example 3, the boron component volatilization layer green sheet and the heat resistant layer green sheet were laminated such that the boron component volatilization layer 2 and the heat resistant layer 3 were laminated as shown in FIG. 5. That is, the dopant hosts of Examples 2 and 3 each had substantially the same configuration as the dopant host of Embodiment 1 above.

Figure 6:
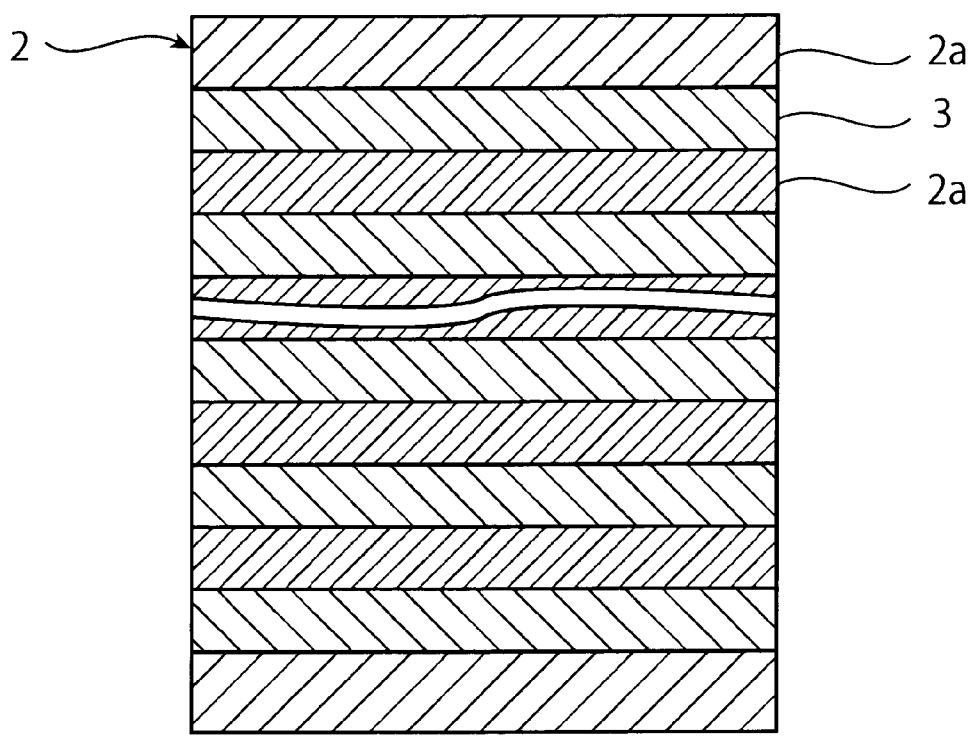
FIG. 6 is a schematic cross-sectional view of a dopant host prepared in Comparative Example 1.
Figure 7:
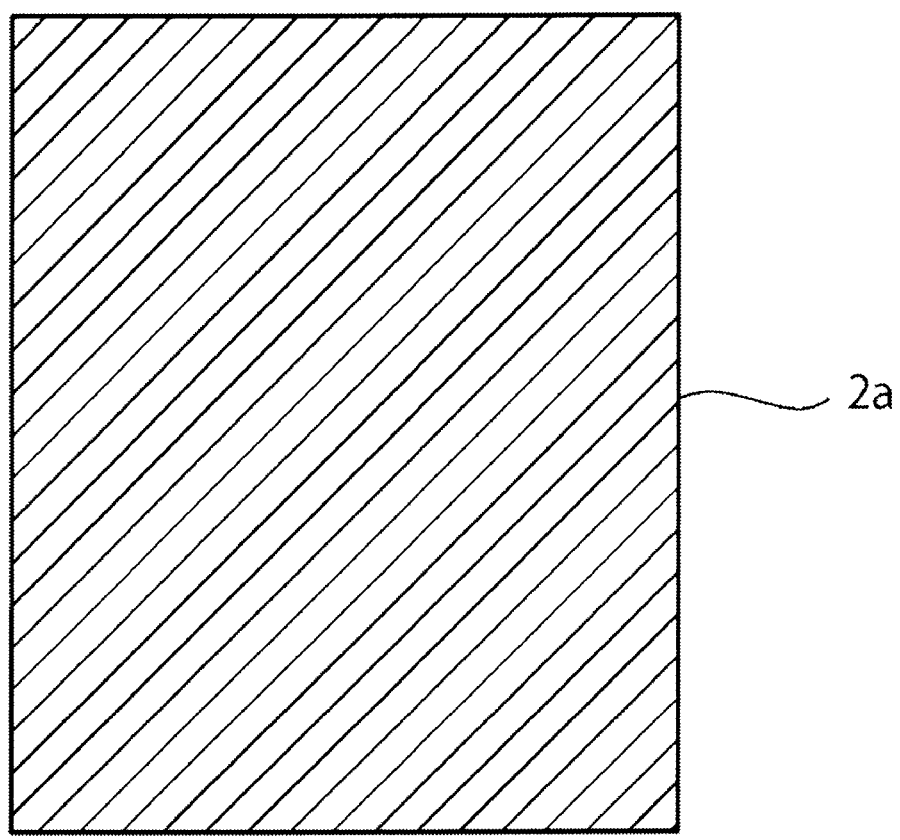
FIG. 7 is a schematic cross-sectional view of a dopant host prepared in Comparative Example 2.

In Comparative Example 1, the boron component volatilization layer green sheet and the heat resistant layer green sheet were laminated such that the boron component volatilization layer 2 and the heat resistant layer 3 were laminated as shown in FIG. 6. That is, the dopant host of Comparative Example 1 had substantially the same configuration as in Embodiment 1 above except that the boron component volatilization layer 2b was replaced by the boron component volatilization layer 2a. That is, in the dopant host of Comparative Example 1, only one kind of boron component volatilization layer was provided.

In the respective dopant hosts of Examples 1 to 3 and Comparative Example 1, the number of boron component volatilization layers laminated was the same. The compositions of the boron component volatilization layer 2 and the heat resistant layer 3 of the resulting dopant hosts are as shown in Table 1.

The heat resistance and the $B_2O_3$ volatility of the respective dopant hosts of Examples 1 to 3 and Comparative Example 1 thus obtained were determined.

Heat resistance was determined as follows. A sintered body was processed into a rectangular parallelepiped having a size of a 50×10×2 mm, and placed on supports that were 30 mm apart. While a load of 15 g was applied to the center, the temperature (upper temperature limit) at which a sample started to deform when the entire sample was heated was measured. Results are shown in Table 1 and FIG. 8 below.

Figure 8:
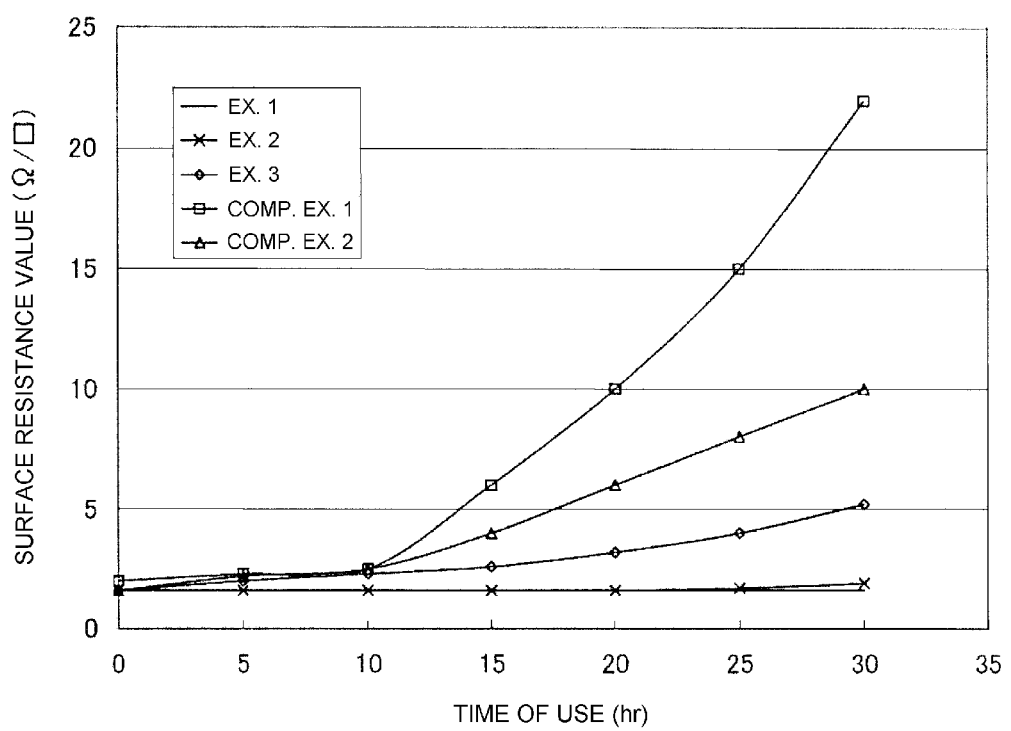
FIG. 8 is a graph showing a change over time of the surface resistance value of a silicon wafer that is doped with a boron component using the respective dopant hosts of Examples 1 to 3 and Comparative Examples 1 and 2.

The $B_2O_3$ volatility was determined as follows. A silicon wafer and each of the dopant hosts of Examples 1 to 3 and Comparative Example 1 were placed on a quartz boat at regular intervals so as to face each other, and sintered at 1150° C. for 2 hours in an electric furnace in which carrier gas flowed, thereby depositing $B_2O_3$ on the silicon wafer. After etching the surfaces of the treated silicon wafer with fluoric acid, electrodes were connected to the silicon wafers to send an electric current and measure a change over time of a surface resistance value. Results are shown in FIG. 8. Note that a little increase over time of the surface resistance value of a silicon wafer means that the amount of $B_2O_3$ deposited on the silicon wafer is large, and the $B_2O_3$ volatility from a dopant host is good.

Comparative Example 2

Glass ingredients blended so as to have a composition presented in Table 1 was placed in a platinum crucible and melted at 1600° C. for 1 hour for vitrification. Then, the molten glass was cast in a mold and annealed to give cylindrical glass having the same diameter as the dopant host of Example 1. The resulting cylindrical glass was heat-treated for crystallization, and cut so as to have the same thickness as the boron dopant of Example 1. Therefore, the dopant host of Comparative Example 2 had a single kind of boron component volatilization layer 2. The heat resistance and the $B_2O_3$ volatility of the resulting dopant host were determined in the same manner as in Example 1. Results are shown in Table 1 and FIG. 8 below.

TABLE 1

| [Mol %] | | Example 1 | Example 2 | Example 3 | Comp. Example 1 | Comp. Example 2 |
|---|---|---|---|---|---|---|
| Boron Component Volatilization Layer 2a | $SiO_2$ | 43 | 43 | 43 | 43 | 43 |
| | $Al_2O_3$ | 18 | 18 | 18 | 18 | 18 |
| | $B_2O_3$ | 29 | 29 | 29 | 29 | 29 |
| | MgO | 3 | 3 | 3 | 3 | 3 |
| | BaO | 7 | 7 | 7 | 7 | 7 |
| Boron Component Volatilization Layer 2b | $SiO_2$ | 41 | 38 | 41 | | |
| | $Al_2O_3$ | 19 | 16 | 19 | | |
| | $B_2O_3$ | 32 | 38 | 32 | | |
| | MgO | 3 | 3 | 3 | | |
| | BaO | 5 | 5 | 5 | | |
| Heat Resistant Layer 3 | $SiO_2$ | 28 | 23 | 28 | 27 | |
| | $Al_2O_3$ | 45 | 45 | 46 | 53 | |
| | $B_2O_3$ | 23 | 29 | 22 | 16 | |
| | MgO | 2 | 1.5 | 2 | 2 | |
| | BaO | 2 | 1.5 | 2 | 2 | |
| Upper Temperature Limit | | 1300° C. or Higher | 1300° C. or Higher | 1300° C. or Higher | 1300° C. or Higher | 1100° C. |

Generally, it can be judged that a silicon wafer having a surface resistance value of 3Ω/□ is usable. Regarding the silicon wafers on which $B_2O_3$ had been deposited using the dopant hosts of Examples 1 to 3, the duration for which the silicon wafers can be used was as good as 20 hours or longer. On the other hand, the duration for which the dopant hosts of Comparative Examples 1 and 2 can be used was as short as 10 hours. Moreover, the dopant host of Comparative Example 2 had a low upper temperature limit of 1100° C.

REFERENCE SIGNS LIST

1 . . . Dopant host
2 . . . Boron component volatilization layer
2a . . . Boron component volatilization layer serving as outermost layer
2b . . . Boron component volatilization layer inside laminate
3 . . . Heat resistant layer

The invention claimed is:

1. A dopant host comprising a laminate comprising a boron component volatilization layer comprising 30 to 60 mol % of $SiO_2$, 10 to 30 mol % of $Al_2O_3$, 15 to 50 mol % of $B_2O_3$, and 2 to 15 mol % of RO where R is an alkaline earth metal, and a heat resistant layer comprising 8 to 40 mol % of $SiO_2$, 40 to 85 mol % of $Al_2O_3$, 5 to 30 mol % of $B_2O_3$, and 0.5 to 7 mol % of RO where R is an alkaline earth metal,
at least one outermost layer of the laminate being composed of the boron component volatilization layer,
the laminate further comprising the boron component volatilization layer inside the laminate,
the boron component volatilization layer constituting at least one outermost layer of the laminate having a $B_2O_3$ content lower than a $B_2O_3$ content in the boron component volatilization layer inside the laminate.

2. The dopant host according to claim 1, wherein the boron component volatilization layer constituting at least one outermost layer of the laminate has a $B_2O_3$ content at least 1 mol % lower than the $B_2O_3$ content in the boron component volatilization layer inside the laminate.

3. The dopant host according to claim 1, wherein the boron component volatilization layer inside the laminate is disposed so as to be adjacent to the boron component volatilization layer constituting at least one outermost layer of the laminate.

4. The dopant host according to claim 1, wherein the boron component volatilization layer constituting at least one outermost layer of the laminate is thicker than the boron component volatilization layer inside the laminate.

5. The dopant host according to claim 1, wherein the outermost layers of the laminate are both constituted by the boron component volatilization layer.

6. The dopant host according to claim 1, wherein at least one of the boron component volatilization layer and the heat resistant layer comprises crystallized glass.

7. The dopant host according to claim 6, wherein the crystallized glass comprises $Al_4B_2O_9$ crystals.

8. A method for producing a dopant host of claim 1, the method comprising the step of sintering a green sheet laminate in which a first green sheet for forming the boron component volatilization layer and a green sheet for forming the heat resistant layer are laminated, to obtain a laminate comprising the boron component volatilization layer and the heat resistant layer.

* * * * *